(12) United States Patent
Ha

(10) Patent No.: US 9,019,761 B1
(45) Date of Patent: *Apr. 28, 2015

(54) MEMORY DEVICE AND COLUMN DECODER FOR REDUCING CAPACITIVE COUPLING EFFECT ON ADJACENT MEMORY CELLS

(71) Applicant: Winbond Electronics Corp., Taichung (TW)

(72) Inventor: Im-Cheol Ha, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/057,108

(22) Filed: Oct. 18, 2013

(51) Int. Cl.
*G11C 16/04* (2006.01)
*G11C 7/00* (2006.01)
*G11C 5/06* (2006.01)
*G11C 16/02* (2006.01)
*G11C 16/24* (2006.01)
*G11C 7/02* (2006.01)
*G11C 7/06* (2006.01)
*G11C 16/34* (2006.01)
*G11C 16/26* (2006.01)
*G11C 7/18* (2006.01)
*G11C 8/12* (2006.01)

(52) U.S. Cl.
CPC .......... *G11C 16/3427* (2013.01); *G11C 16/24* (2013.01); *G11C 2207/002* (2013.01); *G11C 16/26* (2013.01); *G11C 7/18* (2013.01); *G11C 16/0433* (2013.01); *G11C 8/12* (2013.01)

(58) Field of Classification Search
CPC ...... G11C 16/3427; G11C 15/25; G11C 7/18; G11C 8/12; G11C 16/24; G11C 16/26; G11C 16/0433; G11C 2207/002
USPC ............. 365/185.02, 185.06, 185.11, 185.05, 365/185.13, 63
See application file for complete search history.

(56) References Cited

U.S. PATENT DOCUMENTS

| 2006/0083078 A1* | 4/2006 | Sforzin et al. | 365/189.06 |
| 2012/0063241 A1* | 3/2012 | Kajigaya | 365/189.04 |
| 2012/0268996 A1 | 10/2012 | Park | |
| 2013/0176781 A1* | 7/2013 | Hung | 365/185.05 |

* cited by examiner

*Primary Examiner* — Ly D Pham
(74) *Attorney, Agent, or Firm* — Muncy, Geissler, Olds & Lowe, P.C.

(57) ABSTRACT

A memory device includes a memory cell array and a column decoder. The memory cell array includes a plurality of even local bit lines and a plurality of odd local bit lines. The column decoder includes a plurality of even pass transistors and a plurality of odd pass transistors. Each of the even pass transistors has a, control terminal coupled to a respective one of a plurality of even selection lines, a first terminal coupled to a respective one of the even local bit lines, and a second terminal coupled to an even global bit line. Each of the odd pass transistors has a control terminal coupled to a respective one of a plurality of odd selection lines, a first terminal coupled to a respective one of the odd local bit lines, and a second terminal coupled to an odd global bit line.

11 Claims, 7 Drawing Sheets

MEMORY DEVICE AND COLUMN DECODER FOR REDUCING CAPACITIVE COUPLING EFFECT ON ADJACENT MEMORY CELLS

BACKGROUND OF THE INVENTION

1. Field of the Invention

The disclosure generally relates to a memory device, and more particularly, to a memory device comprising a column decoder for reducing the capacitive coupling effect on adjacent memory cells.

2. Description of the Related Art

FIG. 1 is a diagram for illustrating a conventional memory device 100. As shown in FIG 1, the memory device 100 at least comprises a memory cell array 110 and a column decoder 120. To simplify the diagram, other components of the memory device 100 are omitted and not shown in FIG. 1, The memory cell array 110 comprises a plurality of memory cells. A plurality of word lines WL and a plurality of local bit lines BL are configured to select the memory cells. Furthermore, the column decoder 120 is configured to selectively couple one of the local bit lines BL to a global bit line GBL.

FIG. 2 is a diagram for illustrating a capacitive coupling effect on the conventional memory device 100. As shown in FIG. 2, the memory cell array 110 is implemented with a plurality of memory transistors M1-1 to M3-3 (also known as "memory cells"), With the development of the semiconductor manufacturing process, the size of the memory device 100 is becoming much smaller, and thus the memory transistors M1-1 to M3-3 therein are getting closer to each other. This results in a serious mutual coupling effect due to parasitic capacitances between adjacent elements. For example, when a word line WL2 and a local bit line BL2 are selected, the memory transistors M1-2, M2-2, and M3-2 are enabled, and a current I2 flows through the selected local bit line BL2, the memory transistor M2-2, and a source line VL. Ideally, two adjacent local bit lines BL1 and BL3 should be kept floating and no current is induced from them. Actually, however, unexpected coupling currents I1 and I3 are induced and flow through the memory transistors M1-2 and M3-2 and the unselected local bit lines BL1 and BL3 because of the capacitive coupling effect between the memory transistors M1-2, M2-2, and M3-2, This mutual coupling effect may lead to some operation errors and degrade the reliability of the memory device 100.

BRIEF SUMMARY OF THE INVENTION

In a preferred embodiment, the disclosure is directed to a memory device, comprising: a memory cell array, comprising a plurality of even local bit lines and a plurality of odd local bit lines; and a column decoder, comprising: a plurality of even pass transistors, wherein each of the even pass transistors has a control terminal coupled to a respective one of a plurality of even selection lines, a first terminal coupled to a respective one of the even local bit lines, and a second terminal coupled to an even global hit line; and a plurality of odd pass transistors, wherein each of the odd pass transistors has a control terminal coupled to a respective one of a plurality of odd selection lines, a first terminal coupled to a respective one of the odd local bit lines, and a second terminal coupled to an odd global bit line; wherein the even global bit line is different from the odd global bit line.

In another preferred embodiment, the disclosure is directed to a method for controlling a memory device, comprising the steps of: providing a memory cell array, wherein the memory cell array comprises a plurality of even local bit lines and a plurality of odd local bit lines; providing a column decoder, wherein the column decoder comprises a plurality of even pass transistors and a plurality of odd pass transistors, wherein the even pass transistors are configured to selectively couple the even local bit lines to an even bit line, and the odd pass transistors are configured to selectively couple the odd local bit lines to an odd global bit line, and wherein the even global bit line is different from the odd global bit line; selecting and enabling one of the even pass transistors or one of the odd pass transistors; when one of the even pass transistors is selected and enabled, disabling the other unselected even pass transistors, enabling all of the odd pass transistors, and pulling down all of the odd local bit lines to a ground voltage by the odd global bit line; arid when one of the odd pass transistors is selected and enabled, disabling the other unselected odd pass transistors, enabling all of the even pass transistors, and pulling down all of the even local bit lines to the ground voltage by the even global bit line.

BRIEF DESCRIPTION OF DRAWINGS

The invention can be more fully understood by reading subsequent detailed description and examples with references made to the accompanying drawings, wherein.

DESCRIPTION OF THE INVENTION

In order to illustrate the purposes, features and advantages of the invention, the embodiments and figures thereof in the invention are described in detail as follows.

Figure 3:
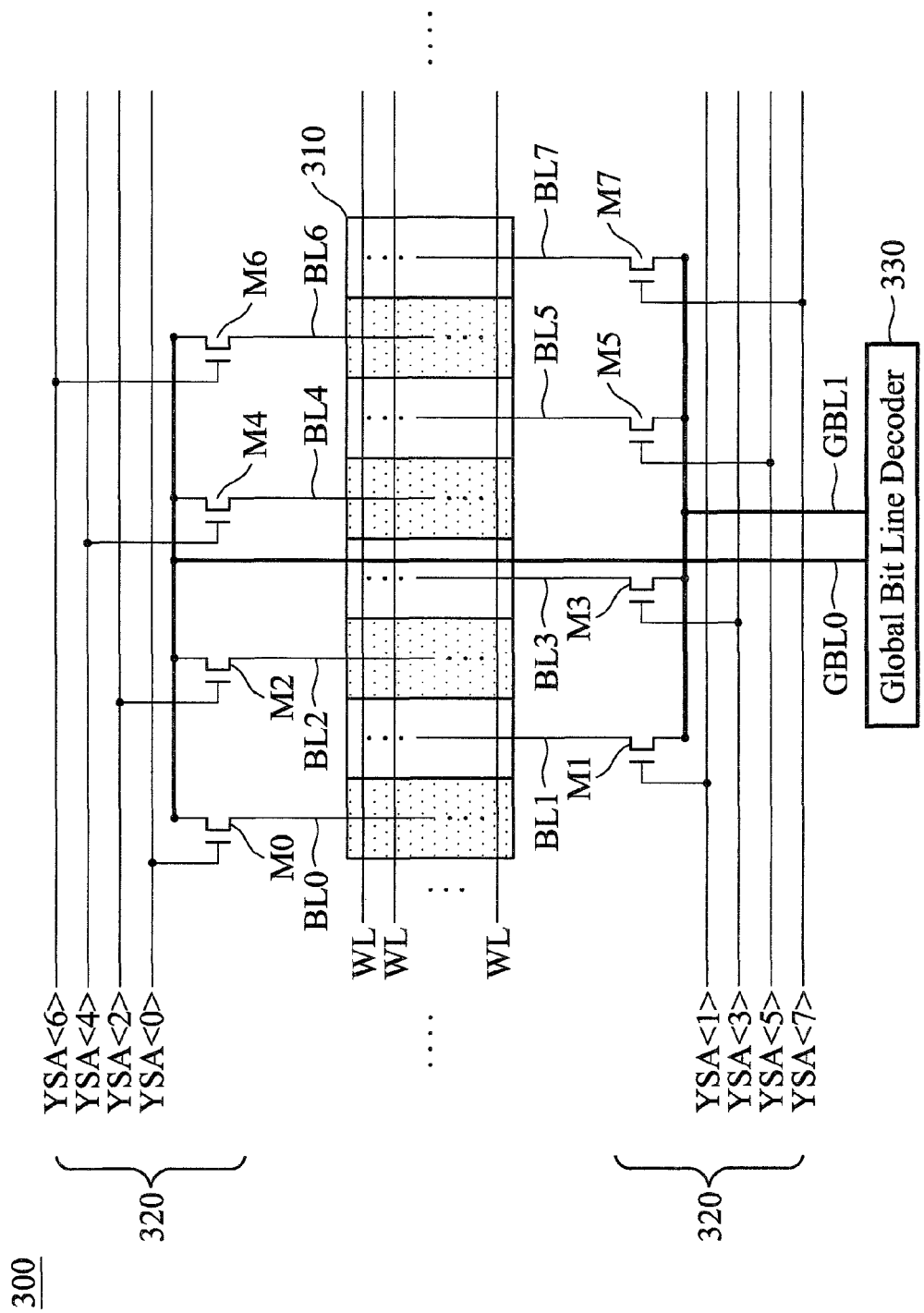
FIG. 3 is a diagram for illustrating a memory device according to an embodiment of the invention.

FIG. 3 is a diagram for illustrating a memory device 300 according to an embodiment of the invention. The memory device 300 may be flash memory, such as NOR flash memory. As shown in FIG. 3, the memory device 300 at least comprises a memory cell array 310 and a column decoder 320. It is understood that the memory device 300 may further comprise other components, such as a driver, a row decoder, and an SA (Sense Amplifier). To simplify the diagram, some components of the memory device 300 are omitted and not shown in FIG. 3. The memory cell array 310 comprises a plurality of memory cells. In some embodiments, the memory cell array 310 is EEPROM (Electrically-Erasable Programmable Read-Only Memory). The memory cell array 310 further comprises a plurality of word lines WL and a plurality of local bit lines BL0 to BL7 for operating the memory cells.

The local bit lines BL0 to BL7 may be categorized as a plurality of even local bit lines BL0, BL2, BL4, and BL6, and a plurality of odd local hit lines BL1, BL3, BL5, and BL7. Each even or odd local bit line is coupled to some memory cells arranged in a respective column. In some embodiments, the even local bit lines BL0, BL2, BL4, and BL6 are respectively interleaved with the odd local bit lines BL1, BL3, BL5, and BL7. The column decoder 320 is configured to selectively couple one or more of the even local bit lines BL0, BL2, BL4, and BL6 to an even global hit line GBL0, and/or configured to selectively couple one or more of the odd local bit lines BL1, BL3, BL5, and BL7 to an odd global bit line GBL1. The even global bit line GBL0 is different and separate from the odd global bit line GBL1. In some embodiments, the memory device 300 may further comprise a global bit line decoder 330. The even global bit line GBL0 and the odd global bit line GBL1 are coupled to the global bit line decoder 330, and are controlled by the global bit line decoder 330. For example, the global bit line decoder 330 may be configured to select one of the even global bit line GBL0 and the odd global bit line GBL1 as an input/output terminal, and configured to adjust a voltage of the other one of the even global bit line GBL0 and the odd global bit line GBL1. In some embodiments, the column decoder 320 and the global bit line decoder 330 are controlled together according to a control signal from a driver or a processor (not shown).

More particularly, the column decoder 320 comprises an upper-half portion and a lower-half portion. The upper-half portion comprises a plurality of even pass transistors M0, M2, M4, and M6, and the lower-half portion comprises a plurality of odd pass transistors M1, M3, M5, and M7. It is understood that the memory device 300 may comprise more or less local bit lines, global bit lines, and pass transistors although there are only eight element branches shown in FIG. 3. The number of local bit lines, global bit lines, and pass transistors is not limited in the invention. In some embodiments, the memory cell array 310 and the column decoder 320 may be copied many times and disposed in a periodic form, and only a portion of the periodic form is shown in FIG. 3.

Each of the even pass transistors M0, M2, M4, and M6 has a control terminal coupled to a respective one of a plurality of even selection lines YSA<0>, YSA<2>, YSA<4>, and YSA<6>. For example, the even pass transistor M0 has a gate coupled to the even selection line YSA<0>. Each of the even pass transistors M0, M2, M4, and M6 has a first terminal coupled to a respective one of the even local bit lines BL0, BL2, BL4, and BL6. For example, the even pass transistor M0 has a source/drain coupled to the even local bit line BL0. Each of the even pass transistors M0, M2, M4, and M6 has a second terminal coupled to the even global bit line GBL0. For example, the even pass transistor M0 has another source/drain coupled to the even global bit line GBL0. Each of the odd pass transistors M1, M3, M5, and M7 has a control terminal coupled to a respective one of a plurality of odd selection lines YSA<1>, YSA<3>, YSA<5>, and YSA<7>. For example, the odd pass transistor M1 has a gate coupled to the odd selection line YSA<1>. Each of the odd pass transistors M1, M3, M5, and M7 has a first terminal coupled to a respective one of the odd local bit lines BL1, BL3, BL5, and BL7. For example, the odd pass transistor M1 has a source/drain coupled to the odd local bit line BL1. Each of the odd pass transistors M1, M3, M5, and M7 has a second terminal coupled to the odd global bit line GBL1. For example, the odd pass transistor M1 has another source/drain coupled to the odd global bit line GBL1. In some embodiments, the even pass transistors M0, M2, M4, and M6 and the odd pass transistors M1, M3, M5, and M7 are NMOS transistors (N-type Metal-Oxide-Semiconductor Field-Effect Transistor).

The column decoder 320 selects one of the even local bit lines BL0, BL2, BL4, and BL6 by controlling the even selection lines YSA<0>, YSA<2>, YSA<4>, and YSA<6>. For example, when the even local bit line BL2 and the corresponding even pass transistor M2 are selected, the even selection line YSA<2> is pulled up to a high voltage (e.g., 1V or 4.5V), and the other even selection lines YSA<0>, YSA<4>, and YSA<6> are pulled down to a ground voltage (e.g., 0V). Accordingly, the even pass transistor M2 is enabled, and thus the even local bit line BL2 is coupled to the even global bit line GBL0. Similarly, the column decoder 320 selects one of the odd local bit lines BL1, BL3, BL5, and BL7 by controlling the odd selection lines YSA<1>, YSA<3>, YSA<5>, and YSA<7>. For example, when the odd local bit line BL3 and the corresponding odd pass transistor M3 are selected, the odd selection line YSA<3> is pulled up to a high voltage (e.g., 1V or 4.5V), and the other odd selection lines YSA<1>, YSA<5>, and YSA<7> are pulled down to a ground voltage (e.g., 0V). Accordingly, the odd pass transistor M3 is enabled, and thus the odd local bit line BL3 is coupled to the odd global bit line GBL1. The selection of other and odd local bit lines may be performed in a similar way to the above. The configuration of the memory device 300 and the column decoder 320 therein can reduce the mutual coupling effect between adjacent memory cells. The detailed operations will he described in the following embodiments.

Figure 4:
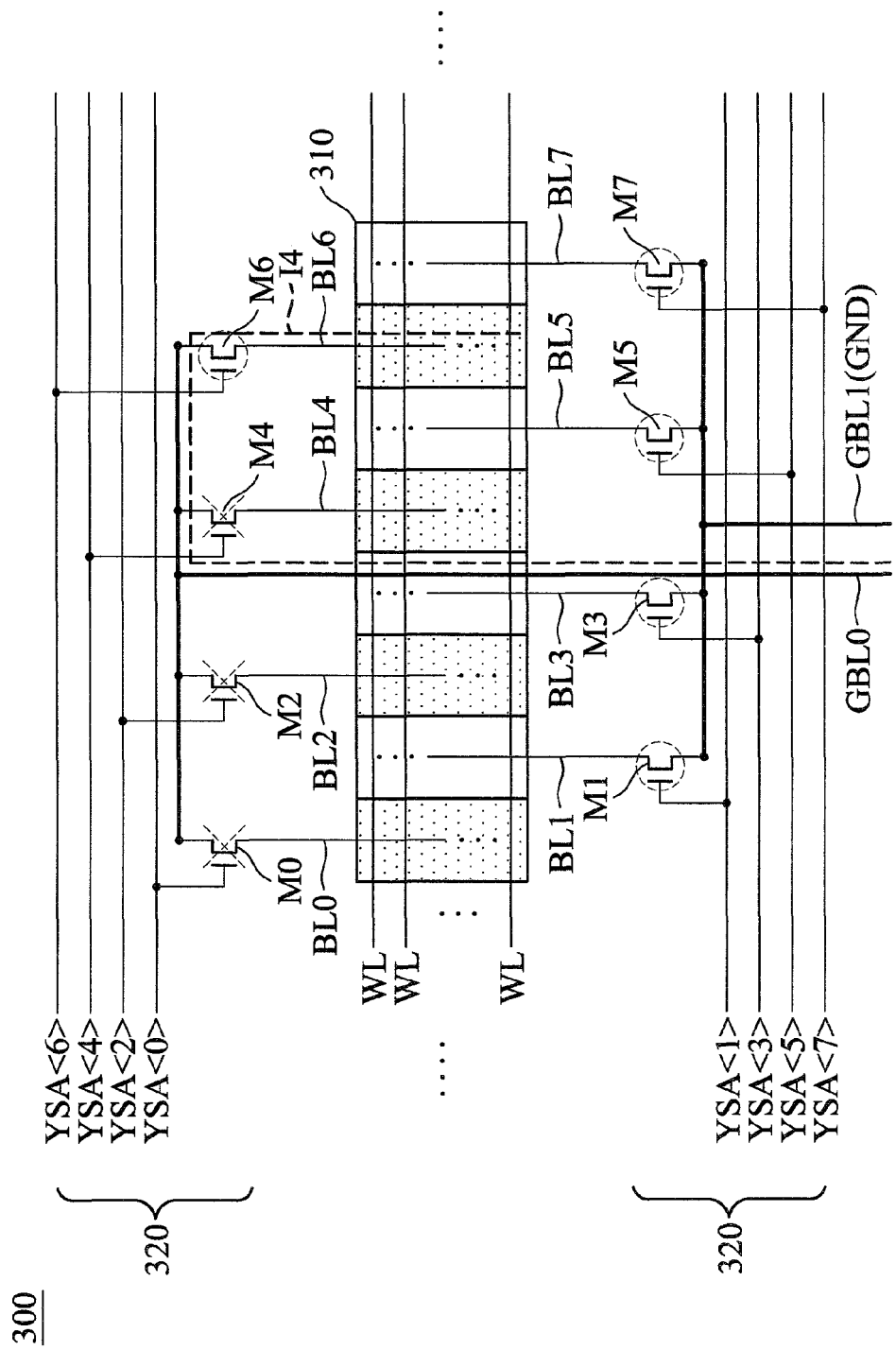
FIG. 4 is a diagram for illustrating an operation of a memory device when any one even local bit tine is selected, according to an embodiment of the invention.

FIG. 4 is a diagram for illustrating the operation of the memory device 300 when any one even local bit line is selected, according to an embodiment of the invention. When any one of the even pa transistors M0, M2, M4, and M6 is selected and enabled, the corresponding even local bit line is selected and coupled to the even global bit line GBL0. At this time, the other unselected even pass transistors are disabled, and all of the odd pass transistors M1, M3, M5, and M7 are enabled. Furthermore, the odd global bit line GBL1 is coupled to a ground voltage by the global bit line decoder 330. Since all of the odd pass transistors M1, M3, M5, and M7 are enabled, all of the odd local bit lines BL1, BL3, BL5, and BL7 are coupled to the odd global hit line GBL1 and are pulled down to the ground voltage. For example, when the even pass transistor M6 is selected and enabled, the corresponding even local bit line BL6 is selected and coupled to the even global bit line GBL0 (a current I4 may flow through the even pass transistor M6). At this time, the other unselected even pass transistors M0, M2, and M4 are disabled, and all of the odd pass transistors M1, M3, M5, and M7 are enabled. Furthermore, the odd global bit line GBL1 is coupled to a ground voltage by the global bit line decoder 330, and all of the odd local bit lines BL1, BL3, BL5, and BL7 are pulled down to the ground voltage by the odd global bit line GBL1. To be brief, during some operations (e.g., read/program operations) of the memory device 300, one selected even local bit line is always adjacent to two odd local bit lines coupled to a ground voltage.

Figure 5:
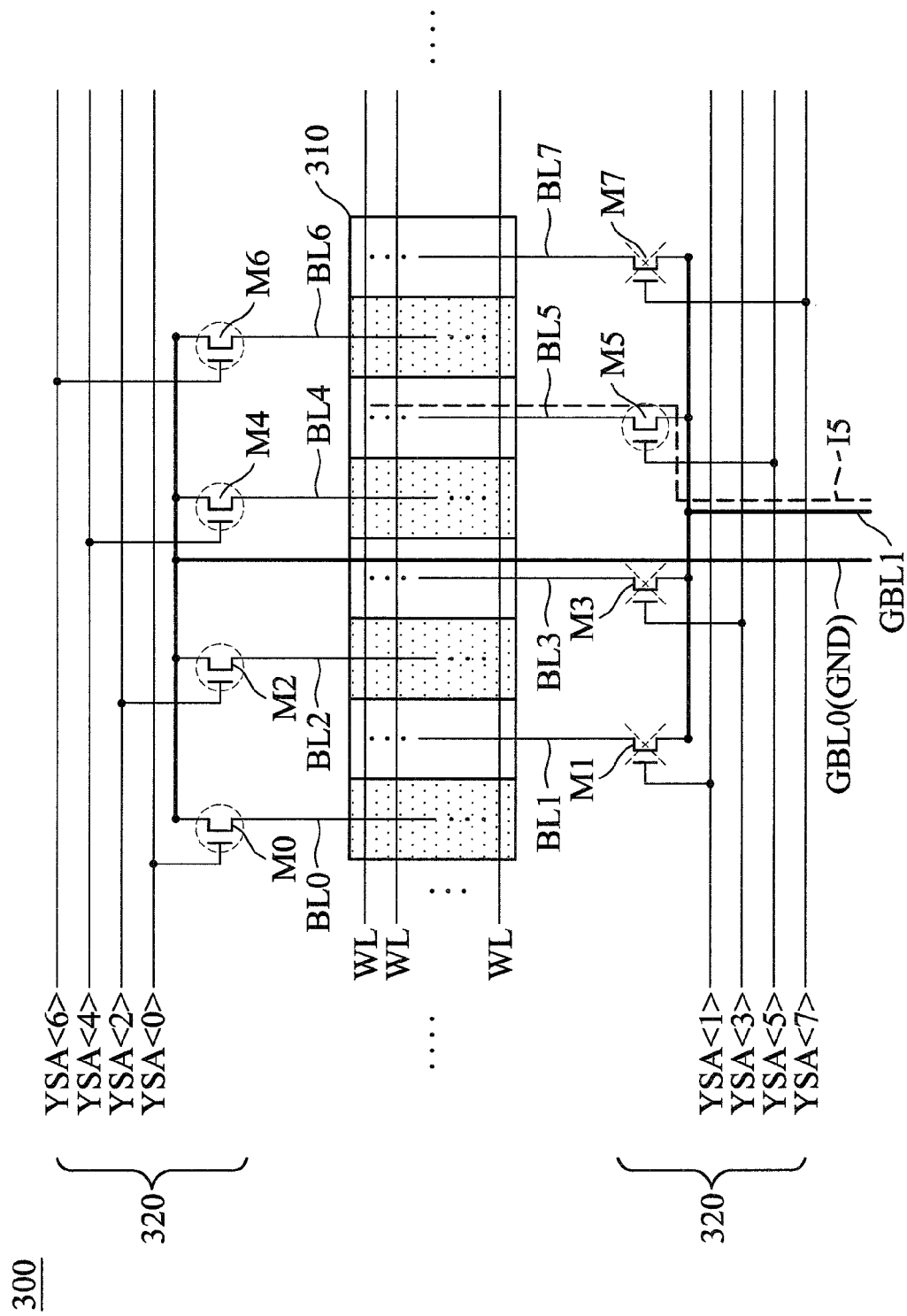
FIG. 5 is a diagram for illustrating an operation of a memory device when any one odd local bit line is selected, according to an embodiment of the invention.

FIG. 5 is a diagram for illustrating the operation of the memory device 300 when any one odd local bit line is selected, according to an embodiment of the invention. When any one of the odd pass transistors M1, M3, M5, and M7 is selected and enabled, the corresponding odd local bit line is selected and coupled to the odd global bit line GBL1. At this time, the other unselected odd pass transistors are disabled, and all of the even pass transistors M0, M2, M4, and M6 are enabled. Furthermore, the even global bit line GBL0 is coupled to a ground voltage by the global bit line decoder 330. Since all of the even pass transistors M0, M2, M4, and M6 are enabled, all of the even local bit lines BL0, BL2, BL4, and BL6 are coupled to the even global bit line GBL0 and are pulled down to the ground voltage. For example, when the odd pass transistor M5 is selected and enabled, the corresponding odd local bit line BL5 is selected and coupled to the odd global bit line GBL1 (a current I5 may flow through the odd pass transistor M5). At this time, the other unselected odd pass transistors M1, M3, and M7 are disabled, and all of the even pass transistors M0, M2, M4, and M6 are enabled. Furthermore, the even global bit line GBL0 is coupled to a ground voltage by the global bit line decoder 330, and all of the even local bit lines BL0, BL2, BL4, and BL6 are pulled down to the ground voltage by the even global bit line GBL0. To be brief, during some operations (e.g., read/program operations) of the memory device 300, one selected odd local bit line is always adjacent to two even local bit lines coupled to a ground voltage.

Figure 1:
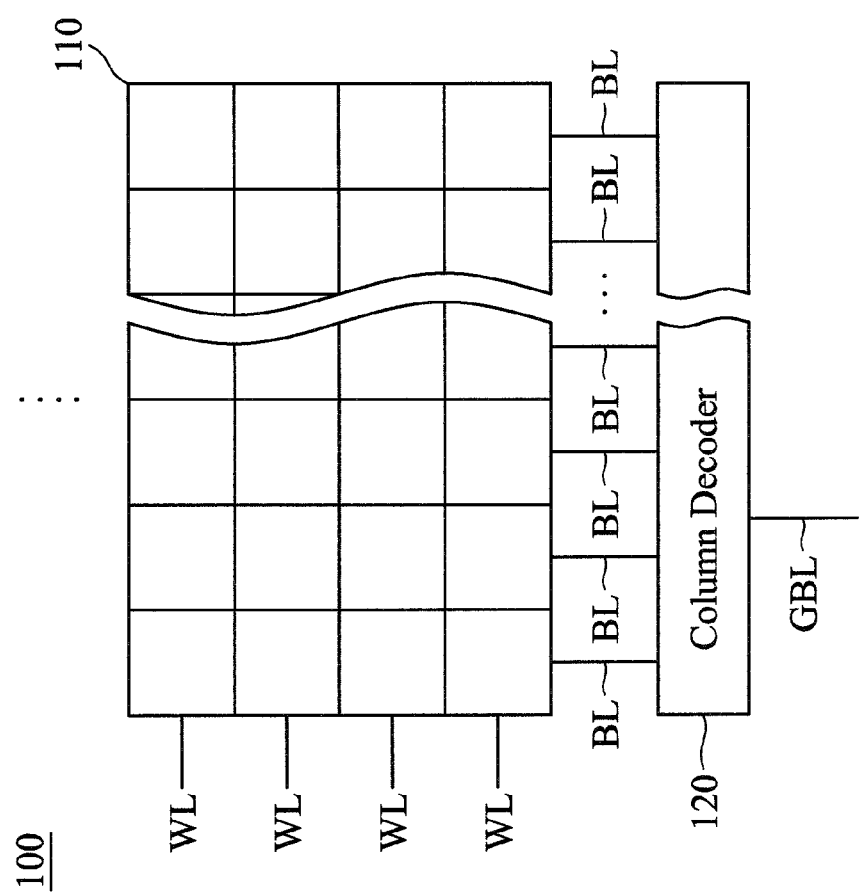
FIG. 1 is a diagram for illustrating a conventional memory device.
Figure 2:
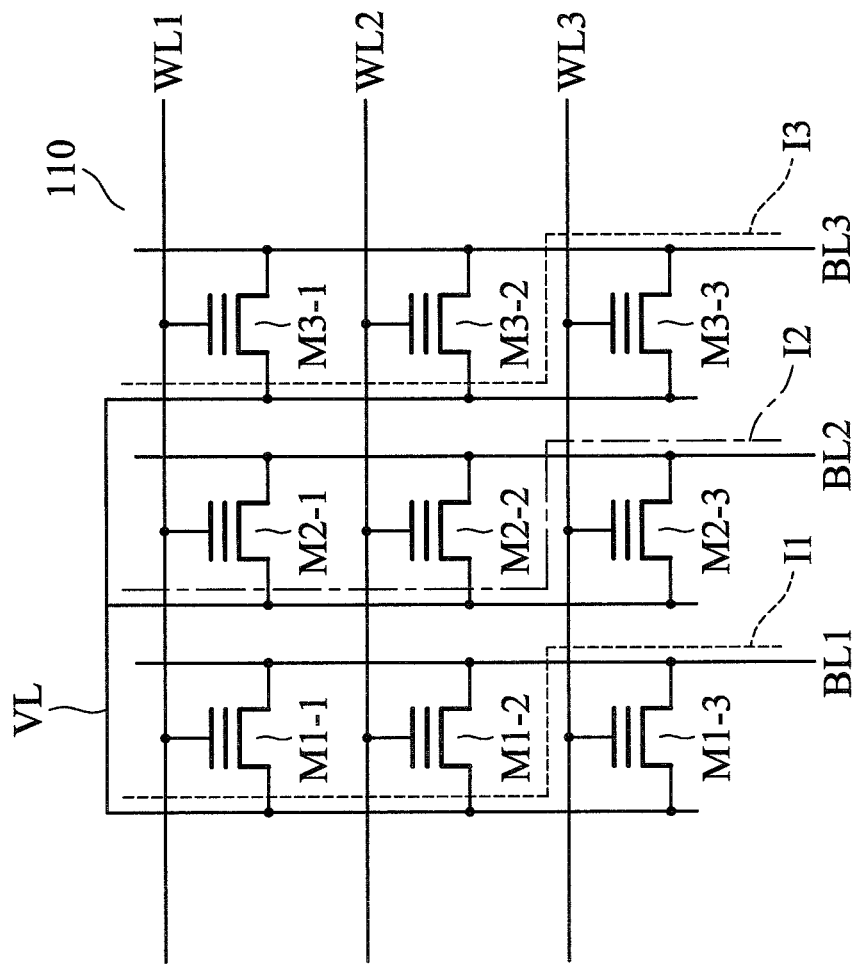
FIG. 2 is a diagram for illustrating a capacitive coupling effect on a conventional memory device.
Figure 6:
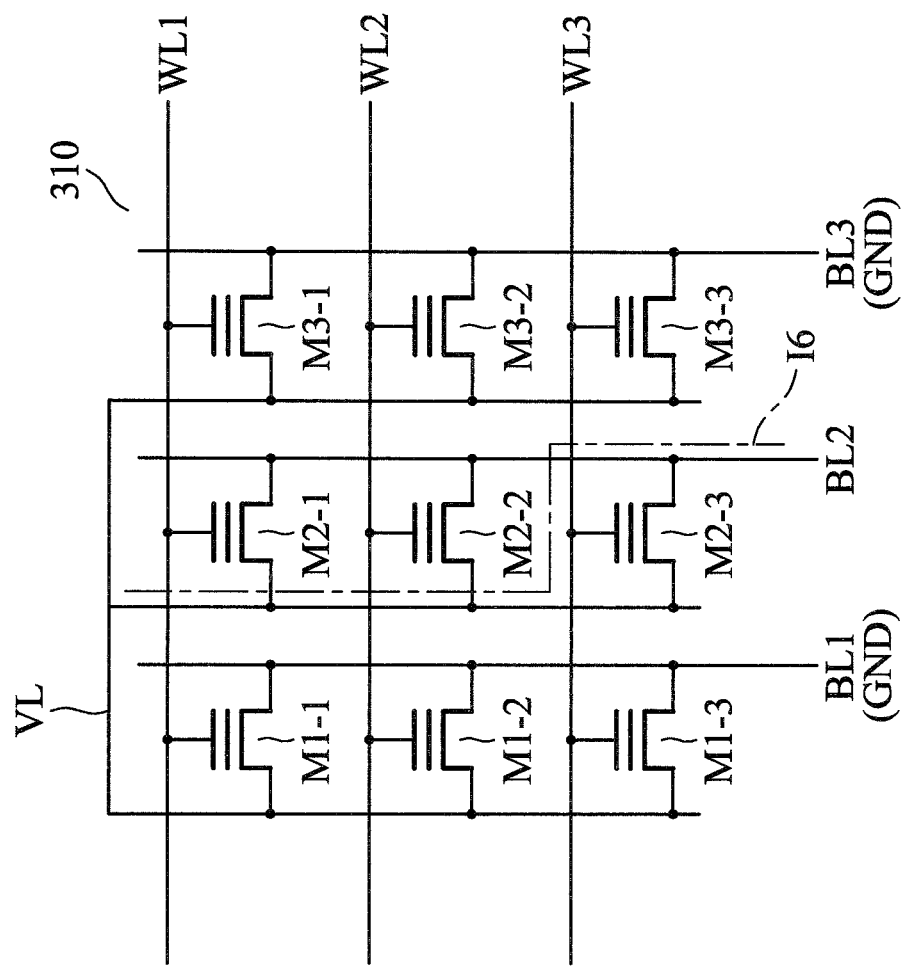
FIG. 6 is a diagram for illustrating a benefit of a memory device according to an embodiment of the invention.

FIG. 6 is a diagram for illustrating the benefit of the memory device 300 according to an embodiment of the invention. As shown in FIG. 6, the memory cell array 310 may comprise a plurality of memory transistors M1-1 to M3-3 (also known as "memory cells"). To simplify the diagram, it is understood that some components of the memory device 300 are omitted and not shown in FIG. 6. Please refer to the embodiment of FIG. 6 in comparison to the conventional design of FIG. 1. When a word line WL2 and a local bit line BL2 are selected, the memory transistors M1-2, M2-2, and M3-2 are enabled, and a current I6 flows through the selected local bit line BL2, the memory transistor M2-2, a source line VL. Since the separate even and odd global bit lines are incorporated to control these local bit lines, during the operation of the memory device 300, the adjacent local bit lines BL1 and BL3 are both pulled down to a ground voltage GND, instead of being float, and no unexpected coupling currents are induced and flowing through the memory transistors M1-2 and M3-2 and the local bit lines BL1 and BL3. Accordingly, the capacitive coupling effect on adjacent memory cells is effectively eliminated in the invention. In comparison to the prior art, the memory device and the column decoder of the invention can provide higher reliability and lower error rates.

Figure 7:
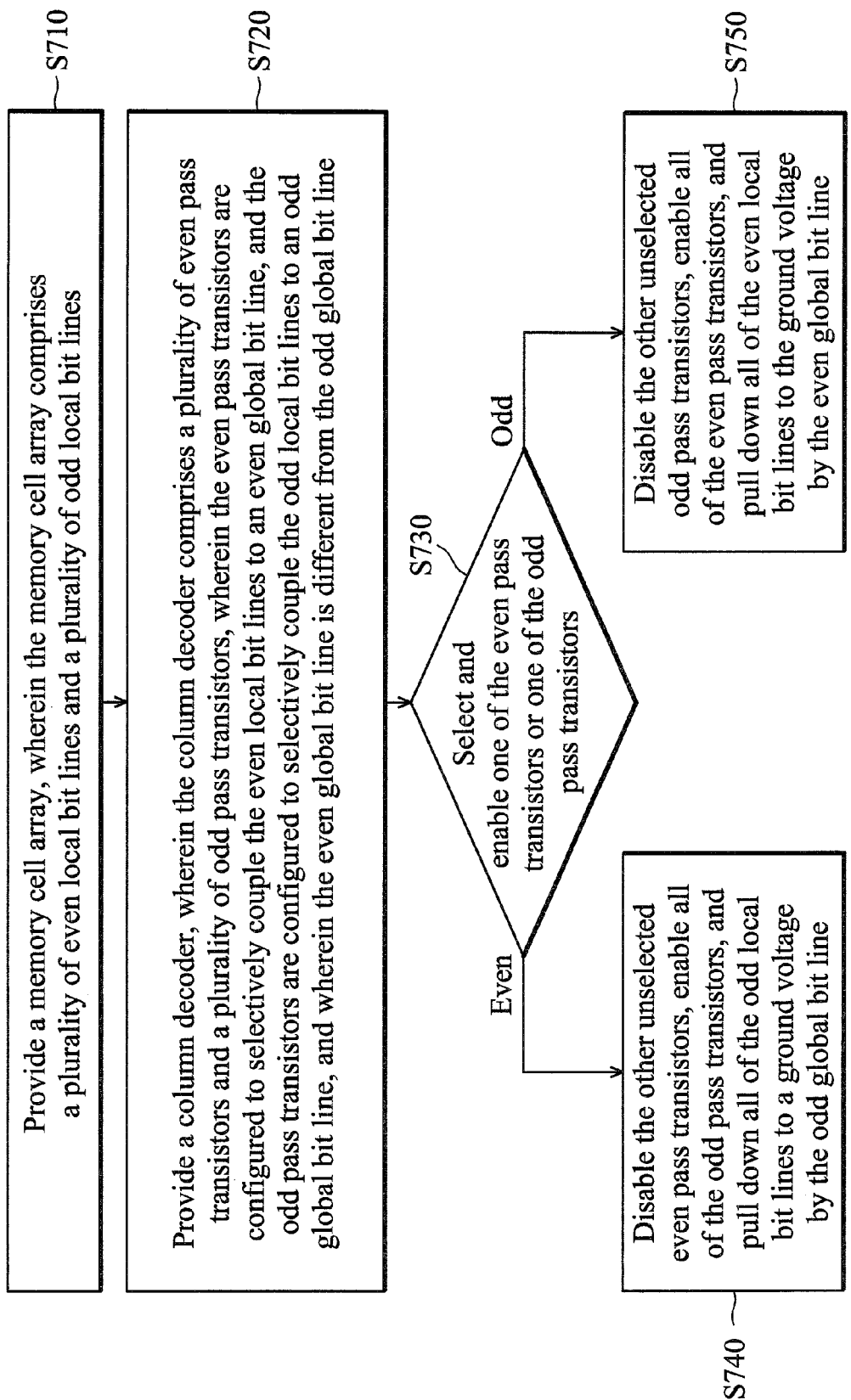
FIG. 7 is a flowchart for illustrating a method for controlling a memory device, according to an embodiment of the invention.

FIG. 7 is a flowchart for illustrating a method for controlling a memory device according to an embodiment of the invention. In step S710, a memory cell array is provided, wherein the memory cell array comprises a plurality of even local bit lines and a plurality of odd local bit lines. In step S720, a column decoder is provided, wherein the column decoder comprises a plurality of even pass transistors and a plurality of odd pass transistors, wherein the even pass transistors are configured to selectively couple the even local bit lines to an even global bit line, and the odd pass transistors are configured to selectively couple the odd local bit line to an odd global bit line, and wherein the even global bit line is different from the odd global bit line. In step S730, one of the even pass transistors or one of the odd pass transistors is selected and enabled. When one of the even pass transistors is selected and enabled, in step S740, the other unselected even pass transistors are disabled, all of the odd pass transistors are enabled, and all of the odd local bit lines are pulled down to a ground voltage by the odd global bit line. When one of the odd pass transistors is selected and enabled, in step S750, the other unselected odd pass transistors are disabled, all of the even pass transistors are enabled, and all of the even local bit lines are pulled down to the ground voltage by the even global bit line. In some embodiments, the even global bit line and the odd global bit line are controlled by a global bit line decoder. It is understood any one or more features of the embodiments of FIGS. 3 to 6 may be applied to the method of FIG. 7.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A memory device, comprising:
    a memory cell array, comprising a plurality of even local bit lines and a plurality of odd local bit lines; and
    a column decoder, comprising:
        a plurality of even pass transistors, wherein each of the even pass transistors has a control terminal coupled to a respective one of a plurality of even selection lines, a first terminal coupled to a respective one of the even local bit lines, and a second terminal coupled to an even global bit line; and
        a plurality of odd pass transistors, wherein each of the odd pass transistors has a control terminal coupled to a respective one of a plurality of odd selection lines, a first terminal coupled to a respective one of the odd local bit lines, and a second terminal coupled to an odd global bit line;
    wherein the even global bit line is different from the odd global bit line; and
    wherein when one of the even pass transistors is selected and enabled, the other unselected even pass transistors are disabled, and all of the odd pass transistors are enabled.

2. The memory device as claimed in claim 1, wherein when one of the even pass transistors is selected and enabled, all of the odd local bit lines are pulled down to a ground voltage by the odd global bit line.

3. The memory device as claimed in claim 1, wherein when one of the odd pass transistors is selected and enabled, the other unselected odd pass transistors are disabled, and all of the even pass transistors are enabled.

4. The memory device as claimed in claim 3, wherein when one of the odd pass transistors is selected and enabled, all of the even local bit lines are pulled down to a ground voltage by the even global bit line.

5. The memory device as claimed in claim 1, further comprising:
    a global bit line decoder, wherein the even global bit line and the odd global bit line are coupled to the global bit line decoder and are controlled by the global bit line decoder.

6. The memory device as claimed in claim 1, wherein the even local bit lines are respectively interleaved with the odd local bit lines.

7. The memory device as claimed in claim 1, wherein the even pass transistors and the odd pass transistors are NMOS transistors (N-type Metal-Oxide-Semiconductor Field-Effect Transistor).

8. A method for controlling a memory device, comprising the steps of:
    providing a memory cell array, wherein the memory cell array comprises a plurality of even local bit lines and a plurality of odd local bit lines;
    providing a column decoder, wherein the column decoder comprises a plurality of even pass transistors and a plurality of odd pass transistors, wherein the even pass transistors are configured to selectively couple the even local bit lines to an even global bit line, and the odd pass transistors are configured to selectively couple the odd local bit lines to an odd global bit line, and wherein the even global bit line is different from the odd global bit line;

selecting and enabling one of the even pass transistors or one of the odd pass transistors;

when one of the even pass transistors is selected and enabled, disabling the other unselected even pass transistors, enabling all of the odd pass transistors, and pulling down all of the odd local bit lines to a ground voltage by the odd global bit line; and when one of the odd pass transistors is selected and enabled, disabling the other unselected odd pass transistors, enabling all of the even pass transistors, and pulling down all of the even local bit lines to the ground voltage by the even global bit line.

9. The method as claimed in claim 8, further comprising:

controlling the even global bit line and the odd global bit line by a global bit line decoder.

10. The method as claimed in claim 8, wherein the even local bit lines are respectively interleaved with the odd local bit lines.

11. The method as claimed in claim 8, wherein the even pass transistors and the odd pass transistors are NMOS transistors (N-type Metal-Oxide-Semiconductor Field-Effect Transistor).

* * * * *